United States Patent [19]

Flannagan et al.

[11] Patent Number: 4,716,302
[45] Date of Patent: Dec. 29, 1987

[54] IDENTITY CIRCUIT FOR AN INTEGRATED CIRCUIT USING A FUSE AND TRANSISTOR ENABLED BY A POWER-ON RESET SIGNAL

[75] Inventors: Stephen T. Flannagan, Austin; Lawrence J. Day, Manchaca, both of Tex.; Barry A. Simon, San Jose, Calif.

[73] Assignee: Motorola, Inc., Schaumburg, Ill.

[21] Appl. No.: 945,253

[22] Filed: Dec. 22, 1986

[51] Int. Cl.[4] .................................... H03K 17/18
[52] U.S. Cl. ......................... 307/200 B; 307/202.1; 307/441; 307/468; 307/594
[58] Field of Search ............... 307/200 B, 441, 202.1, 307/448, 219, 465, 468, 469, 570, 575, 577, 584–585, 591, 594; 340/649, 660, 825.83, 825.84, 825.91; 361/56, 91, 100, 101, 104

[56] References Cited

U.S. PATENT DOCUMENTS

| | | | |
|---|---|---|---|
| 4,061,928 | 12/1977 | Kessler | 307/200 B |
| 4,103,187 | 7/1978 | Imamura | 307/594 |
| 4,329,685 | 5/1982 | Mahon et al. | 340/825.84 |
| 4,408,245 | 10/1983 | Pryor | 361/56 |
| 4,480,199 | 10/1984 | Varshney et al. | 307/202.1 X |
| 4,525,714 | 6/1985 | Still et al. | 340/825.83 |
| 4,580,063 | 4/1986 | Torelli et al. | 361/91 X |
| 4,588,907 | 5/1986 | Meyer et al. | 307/441 |
| 4,613,959 | 9/1986 | Jiang | 307/441 X |
| 4,687,384 | 8/1987 | Harvey et al. | 307/202.1 |

FOREIGN PATENT DOCUMENTS 0061155 5/1981 Japan .................... 307/200 B

OTHER PUBLICATIONS

Pujol, "COS/MOS Electrostatic Discharge Protection Networks", *Electronic Technology*, vol. 13, Feb. 1979, pp. 40–42.
Gepraegs et al., "Restore Suppression for Partially Good Dynamic FET Array Chips", *IBM T.D.B.*, vol. 27, No. 1, Jun. 1980, pp. 211–212.

*Primary Examiner*—Stanley D. Miller
*Assistant Examiner*—D. R. Hudspeth
*Attorney, Agent, or Firm*—John A. Fisher; Jeffrey Van Myers; James L. Clingan, Jr.

[57] ABSTRACT

An integrated circuit has an identifying circuit coupled to an input. The input has ESD protection. The identifying circuit has a fuse which is in one of two possible states to provide the identifying information. A power on reset circuit provides a pulse in response to application of power to the integrated circuit. A current path between a power supply terminal and the input is provided in response to the power on reset pulse when the fuse is in one state. This current path is blocked when the fuse is in the other state. A user is thus provided with identifying information by the presence or absence of a current path at the input at the time when power is applied.

20 Claims, 4 Drawing Figures

IDENTITY CIRCUIT FOR AN INTEGRATED CIRCUIT USING A FUSE AND TRANSISTOR ENABLED BY A POWER-ON RESET SIGNAL

FIELD OF THE INVENTION

The present invention relates to integrated circuits, and more particularly, to techniques for identifying integrated circuits.

BACKGROUND OF THE INVENTION

In integrated circuits, there has developed a need for identifying a particular integrated circuit based on some characteristic of the integrated circuit. In the case of memories there is often the capability of repairing a particular memory by using what is commonly known as redundancy. There are included redundant rows and/or columns on the particular integrated circuit memory. If one of the regular rows or columns is defective, a redundant row or column is used to replace the defective one. There has become a desire for knowing if the particular memory is one in which a redundant row or column has replaced a regular row or column. Another identity need is for distinguishing between mask sets. A particular type of memory or other device may be manufacturable from two different mask sets. It is desirable to know from which mask set the device was made. One of the techniques which has been developed for indicating this is having a diode-connected transistor coupled between an input and a power supply terminal. The input can be driven so as to forward bias this diode-connected transistor and current can be detected to identify the integrated circuit as having one characteristic. To identify a second characteristic of the integrated circuit, the diode-connected transistor is decoupled, in the case of redundancy, from the input and/or power supply terminal so that no current flows between the input and the power supply terminal even when the diode-connected transistor is forward biased. For mask set identity, this diode-connected transistor simply is not present so that no current flows. There are any number of different characteristics for which a device may be identified. In the case of redundancy it is desirable to be able to perform the identity function with fuses. In other cases, such as mask identity, the circuit useful for allowing the detection can simply be present or not present. Additionally, more than two characteristics can be distinguished by having more than one input selectively provided with circuitry susceptible to being detected.

A diagram of one such input is shown in prior art FIG. 1. Shown in FIG. 1 is input circuit 10 comprised of an input terminal 11, a PN junction diode 12, a resistor 13, a PN junction diode 14, an N channel insulated gate field effect transistor 15, and a fuse 16. Diode 12 has a first terminal connected to input terminal 11 and a second terminal connected to ground. Diode 12 is such that it is reverse biased by any signal above ground potential. Resistor 13 has a first terminal connected to input terminal 11, and a second terminal connected to a node 17. Diode 14 has a first terminal connected to and distributed across resistor 13, and a second terminal connected to ground. Ordinarily, resistor 13 and diode 14 are in fact one in the same diffused resistor disposed in the substrate so that a diode-type junction is present at all locations. Configurations omitting diode 14 are also well known. In such a case resistor 13 would be an ordinary resistor such as a polysilicon resistor. Diode 14 is connected in the same direction as diode 12 so that diode 14 is also reverse biased for poitive voltage inputs applied to input terminal 11. Transistor 15 has a gate and a drain connected to node 17, and a source. Fuse 16 has a first terminal connected to the source of transistor 15, and a second terminal connected to a positive power supply terminal for receiving a positive power supply voltage such as, for example, 5 volts. Node 17 serves as the input for the internal cicuitry of the integrated circuit, and VDD serves as the positive power supply terminal for the integrated circuit. Diodes 12 and 14 and resistor 13 are for electrostatic discharge (ESD) protection. This type of ESD protection is well known.

Circuit 10 can be used for identifying the integrated circuit as having one of two characteristics. A first charactistic is identified when fuse 16 is not blown. This condition is conveniently detected by bringing input terminal 11 to a voltage sufficiently above VDD so as to forward bias diode-connected transistor 15. With diode-connected transistor 15 forward biased, current will flow between input terminal 11 and VDD. This current can be detected to ascertain that the integrated circuit has the first characteristic. To indicate that the integrated circuit has a second characteristic, fuse 16 is blown to open the circuit between node 17 and VDD. Consequently, application of the forward-baising voltage will not result in current flowing. This absence of current flow can be detected to indicate that the integrated circuit has the second characteristic. For mask set identity or some other identity which can be made part of the mask set, fuse 16 and transistor 15 are simply not present. This is detected in the same manner as if fuse 16 were blown.

The approach of FIG. 1 worked fine until it ESD protection began including another diode which was connected between VDD and the input terminal. This is shown in prior art FIG. 2 which shows an input circuit 10' which is the same as the ESD portion of input circuit 10 of FIG. 1 except that input circuit 10' has an additional PN junction diode 18. The common elements between input circuit 10 and input circuit 10' are numbered the same. Diode 18 has a first terminal connected to input terminal 11, and a second input terminal connected to VDD. Diode 18 is connected so that it is not forward biased until the voltage on input terminal 11 exceeds the voltage at VDD by about 0.6 volt. In order for there to be current flow through a forward biased PN junction, there must be about 0.6 volt across the junction in the forward direction. This is also about the threshold voltage of a typical N channel transistor such as N channel transistor 15 in FIG. 1. Consequently, with a diode such as diode 18 connected between the input and VDD, it is not possible to distinguish between a diode-connected transistor that is coupled or decoupled from VDD because of the presence of diode 18. The difficulty then is to provide a technique for providing identifying information while using ESD protection such as that shown in FIG. 2 where there is a diode to VDD as well as to ground.

SUMMARY OF THE INVENTION

An object of the present invention is to provide an improved input circuit for an integrated circuit.

Another object of the invention is to provide an improved input circuit for providing identifying information for an integrated circuit.

Yet another object of the invention is to provide an improved identifying circuit which uses an input circuit with ESD protection.

These and other objects are achieved in an integrated circuit having an input with ESD protection. The ESD protection includes a first diode coupled between the input and a first power supply terminal, and a second diode coupled between the input and a second power terminal. The improvement is an identifying circuit which comprises a power-on-reset circuit and a coupling circuit. The power-on-reset circuit provides a power on reset pulse in response to application of a voltage between the first and second power supply terminals. The coupling circuit provides a current path between the input and the first power supply terminal in response to receiving the power on reset pulse.

DESCRIPTION OF THE INVENTION

Figure 1:
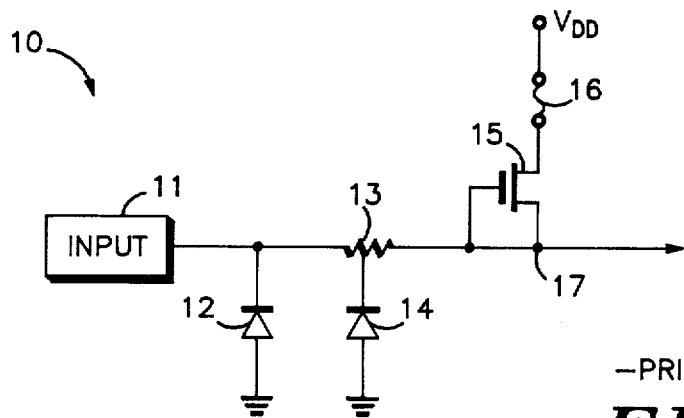
FIG. 1 is a circuit diagram of an identifying circuit of the prior art.
Figure 2:
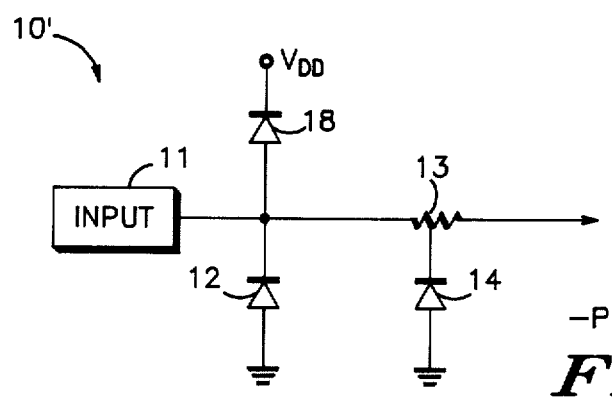
FIG. 2 is a circuit diagram of an input with ESD protection according to the prior art.
Figure 3:
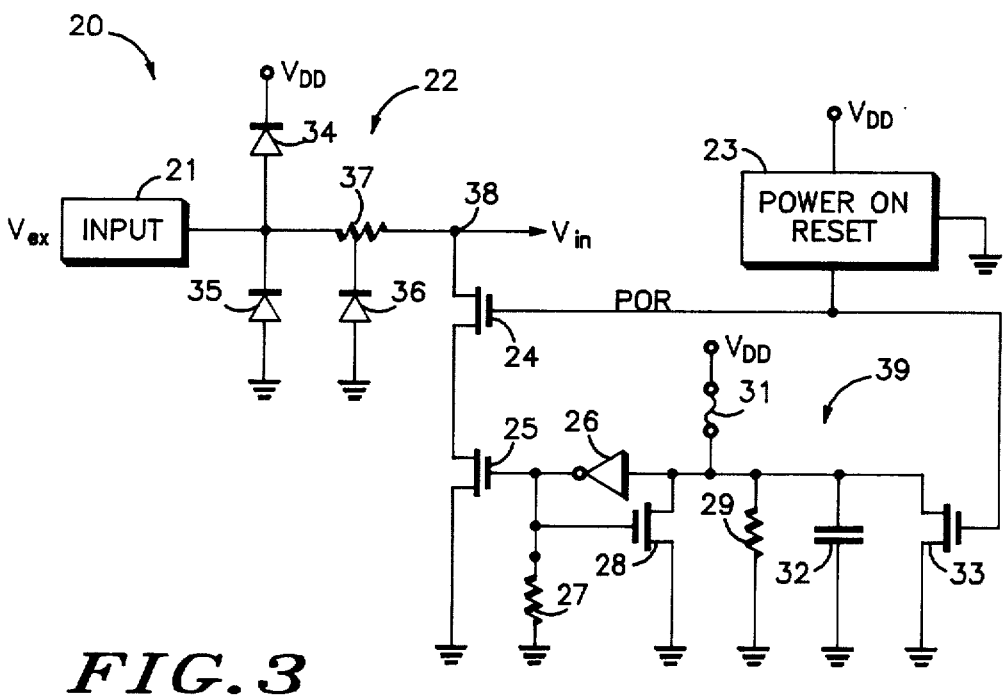
FIG. 3 is a combination circuit and block diagram of an identifying circuit according to a preferred embodiment of the invention.

Shown in FIG. 3 is an identifying input circuit 20 for use in an integrated circuit comprised generally of an input terminal 21, an ESD protection circuit 22, a power on reset circuit 23, an N channel transistor 24, an N channel transistor 25, an inverter 26, a resistor 27, an N channel transistor 28, a resistor 29, a fuse 31, a capacitor 32, and a transistor 33. ESD circuit 22 comprises a PN junction diode 34, a PN junction diode 35, a PN junction diode 36, and a resistor 37. Diode 35 has a first terminal connected to input terminal 21, and a second terminal connected to VDD. Diode 35 has a first terminal connected to input terminal 21, and a second terminal connected to ground. Resistor 37 has a first terminal connected to input terminal 21, and a second input terminal connected to a node 38. Diode 36 has a first terminal distributed across resistor 37, and a second terminal connected to ground. ESD circuit 22 is the same as ESD circuit 10' shown in FIG. 2. Other circuitry not shown is connected to node 38. An external input signal $V_{ex}$ is provided to input terminal 21 and coupled to node 38. The signal received by this other circuitry not shown is an internal input signal $V_{in}$.

Power-on-reset circuit 23 has a first input connected to VDD, a second VDD connected to ground, and an output for providing a power-on-reset signal POR. Signal POR is normally a logic low. In response to an application of a positive power supply voltage between VDD and ground, signal POR rises in voltage until the voltage at VDD with respect to ground reaches some predetermined voltage with respect to ground, for example 2.2 volts, at which time signal POR switches back to ground potential. Power on reset signals such as signal POR are common in integrated circuits. The power on reset signal is generally used to initialize certain circuits to some predetermined state.

Transistor 24 has a drain connected to node 38, a gate connected to the output of power-on-reset circuit 23 for receiving signal POR, and a source. Transistor 25 has a drain connected to the source of transistor 24, a source connected to ground, and a gate. Resistor 27 has a first terminal connected to the gate of transistor 27, and a second terminal connected to ground. Transistor 28 has gate connected to the first terminal of resistor 27, a source connected to ground, and a drain. Inverter 26 has an input connected to the drain of transistor 28, and an output connected to the gate of transistor 25. Resistor 29 has a first terminal connected the input of inverter 26, and a second terminal connected to ground. Fuse 31 has a first terminal connected to VDD, and a second terminal connected to the input of inverter 26. Capacitor 32 has a first terminal connected to the input of inverter 26, and a second terminal connected to the input of inverter 26. Transistor 33 has a drain connected to the input of inverter 26, a gate for receiving signal POR, and a source connected to ground.

Transistors 24, 25, 28, and 33; resistors 27 and 29; inverter 26; capacitor 32; and fuse 31 form an identifying portion 39 of circuit 20. Identifying portion 39 can be used to designate one of two conditions. When fuse 31 is blown, a first condition can be detected. When fuse 31 is not blown, a second condition can be detected. The time for such detection is upon application of VDD. A user who wishes to electrically detect a particular characteristic of an integrated circuit will be able to control the application of the power supply voltage to VDD.

The case for fuse 31 being left intact and thus not blown will be described first. Prior to the application of a voltage to VDD, resistors 27 and 29 cause both the input and output of inverter 26 to be at ground potential. Upon the application of a positive voltage to VDD, the input of inverter 26 will begin rising in voltage due to the very low resistance path provided by fuse 31 between the input of inverter 26 and VDD. As the voltage on VDD rises, signal POR also rises in voltage. As the voltage of signal POR exceeds the threshold voltage of transistor 24, transistor 24 will become conductive. The gate of transistor 25 will remain at ground potential because inverter 26 will provide a logic low output in response to the logic high that is driven into the input of inverter 26 via fuse 31. Transistor 33 also becomes conductive at the point at which signal POR exceeds the N channel threshold voltage of about 0.6 volt. Although transistor 33 is conductive, the input to inverter 26 will follow the voltage of VDD because the resistance of fuse 31 is very low compared to the resistance of transistor 33 in the conductive state. Resistor 29 also has a very large resistance in relation to the resistance of fuse 31. Transistor 25 is thus held in a non-conductive state during the time that signal POR is following the rise of the voltage on VDD. Thus there is no conductive path between node 38 and ground even though transistor 24 is conductive. When VDD reaches the predetermined voltage, which in the present embodiment has been chosen to be about 2.2 volts, signal POR switches to a logic low which causes transistor 24 to become non-conductive. Transistor 33 also becomes non-conductive. The input of inverter 26 remains at a logic high due to VDD being coupled thereto via fuse 31. Inverter 26 thus continues to provide a logic low output which holds transistor 25 in the non-conductive state. The output of inverter 26 also holds transistor 28 in the non-conductive state. The lack of a current path to ground from input terminal 21 can be detected by a user.

For the case in which fuse 31 is blown, the input and output of inverter 26 are also at ground potential at the time prior to application of a positive voltage to VDD. Upon application of a positive voltage to VDD, signal POR begins rising in voltage. When signal POR exceeds the N channel threshold voltage, transistors 24 and 33 become conductive. Capacitor 32 is useful for preventing a noise spike from suddenly raising the voltage on the input of inverter 26 to a level which would be recognized as a logic high. Transistor 33 is used to further ensure that the input of inverter 26 is held to ground. It may be determined that the use of transistor 33 is not needed and may be deleted. As VDD rises and the input of inverter 26 is held to a logic low, inverter 26 outputs a logic high at the voltage present at VDD. This causes transistor 25 to become conductive. This also causes transistor 28 to be conductive. With transistor 28 conductive, inverter 26 is latched in the logic high output state. Signal POR rising above the N channel threshold voltage also causes transistor 24 to become conductive. Transistors 24 and 25 are thus conductive at the same time so that there is a current path available between node 38 and ground. This current path can be detected at terminal 21. Thus a user can determine that fuse 31 has been blown by detecting a current between input terminal 21 and ground.

After the voltage at VDD exceeds 2.2 volts, signal POR switches to a logic low so that transistor 24 becomes non-conductive and thus terminates the current path between input terminal 21 and ground via resistor 37 and transistors 24 and 25. Thus there is no undesirable current path during normal operation of an integrated circuit which uses circuit 20. The current path between input terminal 21 and ground is thus present for a certain range of VDD which must exceed the N channel threshold voltage but be less than 2.2 volts. This circumstance is easily manipulated by a user who wishes to detect such things as whether or not a particular memory has been repaired with the use of redundancy. Other characteristics which might be of interest for detection include whether or not a device is from a particular mask set. In such case fuse 31 would not be necessary. During manufacturing, fuse 31 would be replaced with simply an open or a short. In the case of an open, portion 39 could be omitted entirely. Also several inputs could be similarly equipped with an identifying portion such as portion 39 of FIG. 20. This could then be used for much more than identifying between only two possibilities. For example, three such inputs could distinguish between eight possibilities.

Figure 4:
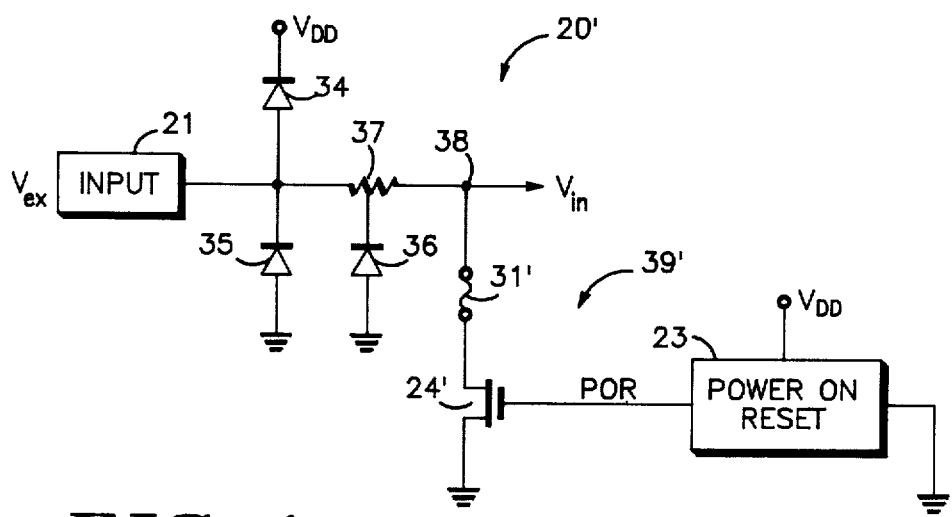
FIG. 4 is a simplified version of the identifying circuit of FIG. 3.

Shown in FIG. 4 is an identifying circuit 20' which is a simplified version of that of FIG. 3. Circuit 20' replaces identifying portion 39 of FIG. 3 with a simplied identifying portion 39' comprised of transistor 24' and fuse 31'. Fuse 31' has a first terminal connected to node 38 and a second terminal. Transistor 24' has a drain connected to the second terminal of fuse 31', a gate for receiving signal POR, and source connected to ground. For the case in which fuse 31' is intact, node 38 is coupled to ground via transistor 24' when signal POR is a logic high as in the case of circuit 20 of FIG. 3. When fuse 31' is blown, there is an open circuit between node 38 and ground. Thus there are two states which can be detected. When the identifying information is susceptible to being placed on the integrated circuit during processing, fuse 31' can be replaced simply by a short circuit or an open circuit. For the case in which there is to be an open circuit between node 38 and ground, identifying portion 39' can simply be not formed at all.

Circuits 20 and 20' thus include the desired ESD protection of circuit 10' while providing the desired identification capability. The identifying portion is only active with respect to the input when the integrated circuit is powering up. During normal operation, identifying portion 39 or 39' does not affect input signal $V_{in}$. The capacitance added by transistor 24 or 24' is no more than would be added by a diode-connected transistor as was done in the prior art but which would not be operable with ESD circuit 22.

We claim:

1. In an integrated circuit having an input with ESD protection having a first diode coupled between the input and a first power supply terminal, and a second diode coupled between the input and a second power terminal, an identifying circuit comprising:
   power on reset means for providing a power on reset pulse in response to application of a voltage between the first and second power supply terminals; and
   control means, coupled to the power on reset means, for coupling the input to the first power supply terminal in response to receiving the power on reset pulse.

2. The integrated circuit of claim 1, wherein the control means comprises a first transistor having a first current electrode coupled to the input, a second current electrode coupled to the first power supply terminal, and a control electrode coupled for receiving the power on reset pulse.

3. The integrated circuit of claim 2 wherein the identifying circuit further comprises:
   fuse means interposed between the first current electrode of the first transistor and the input for providing an open circuit therebetween when the fuse means is in a first condition and for coupling the first current electrode of the first transistor to the input when the fuse means is in a second condition.

4. The integrated circuit of claim 3 wherein the fuse means comprises a fuse having a first terminal coupled to the first current electrode of the first transistor and a second terminal coupled to the input.

5. The integrated circuit of claim 2 wherein the identifying circuit further comprises:
   fuse means interposed between the first power supply terminal and the second current electrode of the first transistor for providing an open circuit therebetween when the fuse means is in a first condition and for coupling the second current electrode of the first transistor to the first power supply terminal when the fuse means is in a second condition.

6. The integrated circuit of claim 5 wherein the fuse means comprises a fuse having a first terminal coupled to the second current electrode of the first transistor and a second terminal coupled to the first power supply terminal.

7. The integrated circuit of claim 1, wherein the identifying circuit further comprises:
   fuse means, coupled in series with the control means, for providing an open circuit in a first condition and a closed circuit in a second condition.

8. An identifying circuit for use at an input of an integrated circuit which receives power between first and second power supply terminals, comprising:
   power on reset means for providing a power on reset pulse in response to application of a voltage between the first and second power supply terminals;
   fuse means for being in one of a first or second state;

first coupling means, coupled to the fuse means, for providing a current path between the input and the first power supply terminal in response to receiving the power on reset pulse when the fuse means is in the first state and blocking said current path when the fuse means is in the second state.

9. The identifying circuit of claim 8 wherein the fuse means is characterized as having a first terminal coupled to the second power supply terminal, and a second terminal; and the coupling means is characterized as comprising:
   a first transistor having a first current electrode coupled to the input, a control electrode for receiving the power on reset pulse, and a second current electrode;
   a second transistor having a first current electrode coupled to the second current electrode of the first transistor, a second current electrode coupled to the first power supply terminal, and a control electrode;
   an inverter having an output coupled to the control electrode of the second transistor, and an input coupled to the second terminal of the fuse means; and
   preset means for holding the input of the inverter at a voltage potential of the first power supply terminal prior to application of the voltage between the first and second power supply terminals.

10. The identifying circuit of claim 9 wherein the preset means comprises a resistor coupled between the first power supply terminal and the input of the inverter.

11. The identifying circuit of claim 10 wherein the coupling means further comprises a capacitor coupled between the input of the inverter and the first power supply terminal.

12. The identifying circuit of claim 11 wherein the coupling means further comprises a third transistor having a control electrode for receiving the power on reset pulse, a first current electrode coupled to the input of the inverter, and a second current electrode coupled to the first power supply terminal.

13. The identifying circuit of claim 12 wherein the coupling means further comprises a fourth transistor having a control electrode coupled to the output of the inverter, a first current electrode coupled to the input of the inverter, and a second current electrode coupled to the first power supply terminal.

14. In an integrated circuit having an input with ESD protection having a first diode coupled between the input and a first power supply terminal, and a second diode coupled between the input and a second power terminal, a method comprising the steps of:

providing a power on reset pulse in response to application of a voltage between the first and second power supply terminals;
providing a fuse in one of a first or second state;
providing a current path between the input and the first power supply terminal in response to receiving the power on reset pulse when the fuse means is in the first state and blocking said current path when the fuse means is in the second state; and
detecting whether or not there is a current path between the input and the first power supply terminal during the presence of the power on reset pulse.

15. An identifying circuit for use at an input of an integrated circuit which receives power between first and second power supply terminals, comprising:
   power on reset means for providing a power on reset pulse in response to application of a voltage between the first and second power supply terminals; and
   first coupling means, coupled to the power on reset means for providing a current path between the input and the first power supply terminal in response to receiving the power on reset pulse.

16. The integrated circuit of claim 15, wherein the coupling means comprises a first transistor having a first current electrode coupled to the input, a second current electrode coupled to the first power supply terminal, and a control electrode coupled for receiving the power on reset pulse.

17. The integrated circuit of claim 16 wherein the identifying circuit further comprises:
   fuse means interposed between the first current electrode of the first transistor and the input for providing an open circuit therebetween when the fuse means is in a first condition and for coupling the first current electrode of the first transistor to the input when the fuse means is in a second condition.

18. The integrated circuit of claim 17 wherein the fuse means comprises a fuse having a first terminal coupled to the first current electrode of the first transistor and a second terminal coupled to the input.

19. The integrated circuit of claim 16 wherein the identifying circuit further comprises:
   fuse means interposed between the first power supply terminal and the second current electrode of the first transistor for providing an open circuit therebetween when the fuse means is in a first condition and for coupling the second current electrode of the first transistor to the first power supply terminal when the fuse means is in a second condition.

20. The integrated circuit of claim 19 wherein the fuse means comprises a fuse having a first terminal coupled to the second current electrode of the first transistor and a second terminal coupled to the first power supply terminal.

* * * * *

UNITED STATES PATENT AND TRADEMARK OFFICE
CERTIFICATE OF CORRECTION

PATENT NO.   : 4,716,302

DATED        : December 29, 1987

INVENTOR(S)  : Stephen T. Flannagan et al

It is certified that error appears in the above-identified patent and that said Letters Patent is hereby corrected as shown below:

Column 6, line 15, insert --supply-- after "power".

Signed and Sealed this

Fourteenth Day of June, 1988

*Attest:*

DONALD J. QUIGG

*Attesting Officer*  *Commissioner of Patents and Trademarks*